United States Patent [19]
Kawakubo et al.

[11] Patent Number: 6,165,837
[45] Date of Patent: Dec. 26, 2000

[54] SEMICONDUCTOR INTEGRATED MEMORY MANUFACTURING METHOD AND DEVICE

[75] Inventors: Takashi Kawakubo, Kanagawa-ken; Noboru Fukushima, Tokyo, both of Japan

[73] Assignee: Kabushiki Kaisha Toshiba, Kawasaki, Japan

[21] Appl. No.: 09/276,727

[22] Filed: Mar. 26, 1999

[30] Foreign Application Priority Data

Mar. 26, 1998 [JP] Japan ................................ 10-078939

[51] Int. Cl.[7] .............................................. H01L 21/8242
[52] U.S. Cl. .......................... 438/244; 438/253; 438/387
[58] Field of Search .................................. 438/243, 244, 438/253, 386, 387, 388

[56] References Cited

U.S. PATENT DOCUMENTS

| | | | |
|---|---|---|---|
| 5,739,563 | 4/1998 | Kawakubo et al. | 257/295 |
| 5,825,609 | 10/1998 | Andricacos et al. | 361/321.4 |
| 5,854,500 | 12/1998 | Krautschneider | 257/300 |
| 5,973,346 | 10/1999 | Pan | 257/303 |
| 6,015,990 | 1/2000 | Hieda et al. | 257/310 |
| 6,037,210 | 3/2000 | Leas | 438/245 |

*Primary Examiner*—Kevin M. Picardat
*Attorney, Agent, or Firm*—Oblon, Spivak, McClelland, Maier & Neustadt, P.C.

[57] ABSTRACT

A method of manufacturing a semiconductor integrated memory device including a plurality of a memory cells, and the semiconductor memory device, wherein each memory cell includes a transistor and a capacitor. The capacitor is formed of first and second electrodes and a dielectric layer. The first electrode and the dielectric layer are successively formed on a main surface of a semiconductor substrate by epitaxial growth. A region of the capacitor is removed to expose a region of the main surface of the substrate under the capacitor. A single crystal semiconductor layer is formed on the exposed region of the substrate by epitaxial growth, and the transistor is formed on the single crystal semiconductor layer, thereby to obtain a device having high integration density integration and preferred performance with high yield.

21 Claims, 12 Drawing Sheets

SEMICONDUCTOR INTEGRATED MEMORY MANUFACTURING METHOD AND DEVICE

CROSS REFERENCE TO RELATED APPLICATIONS

This application claims benefit of priority to Japanese Patent Application No. P10-078939 filed Mar. 26, 1998, the entire disclosure of which is incorporated by reference herein.

BACKGROUND OF THE INVENTION

1. Field of the Invention

The present invention relates to a semiconductor integrated memory manufacturing method and device, more particularly, a semiconductor integrated memory device, and more particularly, to manufacturing method in which a capacitor is formed prior to formation of a transistor on a single substrate.

2. Discussion of the Background

The semiconductor integrated ferroelectric memory device has a non-volatile characteristic such that the device does not lose its stored information even after power source suspension, and is supposed to be introduced into practical use. The device is expected to obtain reading and writing performance as fast as the conventional Dynamic Random Access Memory (DRAM), as has been recently demonstrated when the film thickness of the memory cell capacitor is thin enough such that spontaneous polarization of the capacitor quickly turns around. Also, the memory cell consisting of one transistor and one ferroelectric capacitor can store 1 bit; therefore the semiconductor integrated ferroelectric memory device is suitable for large scale integration.

The ferroelectric thin layer of the capacitor is required to have much remnant polarization, less dependency to temperature change, and long time retention of its remnant polarization. A conventional titanate zirconate lead (PZT) capacitor has been reported, but is unsuitable for fine pattern lithography, because its main component Pb evaporates and diffuses into the capacitor electrodes at low temperature such as 500° C.

A method of forming the ferroelectric layer by an epitaxial growth method has been reported. The epitaxially grown barium strontium titanate ($Ba_xSr_{1-x}TiO_3$ (BSTO)) ferroelectric layer is formed using RF magnetron sputtering on a strontium ruthenate ($SrRuO_3$ (SRO)) lower electrode. The SRO electrode is formed on a strontium titanate ($SrTiO_3$ (STO)) single cryrstal substrate. The magnetron sputter deposited capacitor has preferably has a low rate of miss fit dislocation. BSTO has a larger lattice constant than SRO and the c-axis length of the BLSTO can be artificially controlled by utilizing the epitaxial effect. The c-axis controlled BSTO has a strained lattice structure even when film thickness is 200 nm or more.

The strained lattice structure comprising Ba of over 50 atomic % has been reported to show preferable characteristics such as much remnant polarization at room temperature, long retention of the polarization at around 85° C., and shift of the Curie temperature to higher temperature.

It has been also reported that over 50 atomic % Sr added single crystal BSTO has a dielectric constant of 800, while a polycrystalline layer of same thickness has a dielectric constant of 200. Such a large constant is preferable for a semiconductor memory device, such as a DRAM and Ferroelectric Random Access Memory.

However it is difficult to obtain a 20 mm or more diameter STO substrate with fine crystal structure, and a semiconductor substrate, such as a Si substrate, should be substituted for the STO substrate for practical use, high yield. and low cost.

A practical manufacturing method including the following steps has been also reported, First, a transistor is formed on a Si substrate and an interlayer insulator layer is formed over transistor. Then an opening (contact hole) is formed through the interlayer insulator layer and a single crystal Si plug is formed in the opening by selective vapor phase epitaxial growth or by solid phase epitaxial growth method of an amorphous layer at the bottom c f the opening. An epitaxially grown capacitor is formed on the Si plug to be connected with the transistor electrode and located over the transistor (see U.S. Pat. No. 5,739,563). This method leads to high aspect ratio (depth/width) of the openings, such as 2 or more, and presents difficulty to form numerous openings of such aspect ratio at each of multiple layers. Also it is not preferable to subject the substrate to high temperature above the transistor thermal resistant (around 750–800° C.), while nevertheless such high temperature is desirable to form a fine selectively epitaxially growth layer.

Another practical method utilizing a Semiconductor On Insulator (SOI) substrate is also disclosed in U.S. patent application No. 09/030,809. This second method includes forming an epitaxial capacitor on a main surface of a first substrate and bonding the first substrate and to a second substrate with a $SiO_2$ layer interposed between the main surface of the first substrate and the surface of the second substrate. Another surface of the second surface is polished and a transistor is formed on the polished surface of the second substrate and connected with the capacitor via a contact plug formed through the $SiO_2$ layer using a lithography methods A simple method of forming the capacitor and the transistor on different substrate to be overlapped with each other is preferable to obtain higher density integration than the first method.

However in the second method. the contacts through the bonding interface tend to have voids which prohibit perfect electric connection between the transistor and capacitor pair of each memory cell. Also, position alignment of both the capacitor formed on the first substrate and the transistor formed on the second substrate is difficult.

SUMMARY OF THE INVENTION

Accordingly, it is an object of the present invention to resolve the above problems of conventional technology and provide a semiconductor integrated memory device which can attain high integration density and high process yield.

To that end, according to a first aspect of the present invention, there is provided a semiconductor manufacturing including forming a first electrode on a main surface of a semiconductor substrate; forming a dielectric layer on the first electrode; forming a second electrode on the dielectric layer so as to interpose the dielectric layer between the first and the second electrodes, thereby to form a capacitor; removing a portion of the capacitor so as to expose a portion of the main surface; covering the capacitor side surface of the substrate with an insulator layer; forming a semiconductor single crystal layer on a portion of the main surface; and forming a transistor on the single crystal layer.

According to the first aspect of the invention, the manufacturing method is performed on one substrate and the capacitor and the transistor are formed so as to be overlapped so as to obtain high integration density.

Furthermore, the capacitor is formed prior to the transistor to allow putting the substrate into an atmosphere at a temperature up to thermal resistant of the capacitor, such as 900° C. This becomes more favorable when a selective CVD epitaxial growth step is introduced to the method.

The method manufacturing according to the first aspect of the invention produces the epitaxial capacitor thickness of around 100 nm or less with an aspect ratio of openings in the Si epitaxial layer of 1 or less.

According to the first aspect of the invention, the second electrode may be formed by epitaxial growth.

The manufacturing method according to the first aspect of the invention may further include forming an interlayer insulator layer to cover side and top surfaces of the dielectric capacitor and then forming the epitaxial growth single crystal semiconductor layer insulated by the interlayer insulator layer. The interlayer insulator layer may be formed by forming an insulator layer so as to cover the capacitor and selectively leaving a side wall insulator layer on a side wall of the capacitor by anisotropic etching. The capacitor may be covered with the interlayer insulator layer and the interlayer insulator layer may insulate the adjacent memory cells.

The manufacturing method according to the first aspect of the invention may form the single crystal semiconductor layer by selective epitaxial growth or by solid phase growth, such as epitaxial solid phase growth of an amorphous layer formed previously in the capacitor removed portion.

The manufacturing method according to the first aspect of the invention may further include separate steps of forming a pattern for the transistor on the semiconductor single crystal layer and forming a pattern of the second electrode. The pattern of the semiconductor single crystal layer may be formed utilizing the pattern of the transistor as a mask pattern.

The manufacturing method according to the first aspect of the invention may use a plane substrate surface to form the memory cell.

The manufacturing method according to the first aspect of the invention may further include steps of forming a portion defining a trench in the main surface of the substrate, with the inner surface of the trench having a $\{100\}$ crystal face, wherein the first electrode and the dielectric layer are formed by epitaxial growth method in the trench. More preferably, all inner surfaces have the $\{100\}$ crystal face.

In the manufacturing method according to the first aspect of the invention, the crystal face of either one of the first and the second electrodes may be selected from the group consisting of a $\{100\}$ face of a cubic perovskite crystal structure, a $\{001\}$ face of a tetragonal perovskite structure, and a $\{001\}$ face of a layer perovskite structure. The crystal face of the dielectric layer may be selected from the group consisting of a $\{100\}$ face of a cubic perovskite crystal structure, a $\{001\}$ face of a tetragonal perovskite structure, and a $\{001\}$ face of a layered perovskite structure. Further, either one of the first and the second electrodes may include a material selected from the group consisting of a conductive oxide it material $ABO_3$ of perovskite structure, Pt, Au, Pd, Ir, Rh, Re, Ru, alloys, and oxides thereof. The insulator layer may include $ABO_3$ of perovskite crystal structure, wherein A is an element selected From the group consisting of Ba, Sr, and Ca. and B is an element or an allow selected from the group consisting of Ti, Zr, Hf. Sn, $(Mg_{1/3}Nb_{2/3})$, $(Mg_{1/3}Ta_{2/3})$, $(Zn_{1/3}Nb_{2/3})$, $(Mg_{1/2}Te_{1/2})$, $(Co_{1/2}W_{1/2})$, $(Mg_{1/2})$, $(Mn_{1/2}W_{1/2})$, $(Sc_{1/2}Nb_{1/2})$, $(Mn_{1/2}Nb_{1/2})$, $(Sc_{1/2}Ta_{1/2})$, $(Fe_{1/2}Nb_{1/2})$, $(Co_{1/3}Nb_{2/3})$, $(Ni_{1/3}Nb_{2/3})$, $(Co_{1/3}Ta_{2/3})$, and $(Ni_{1/3}Ta_{2/3})$.

In the manufacturing method according to the first aspect of the invention, the semiconductor substrate and the single crystal layer may consist essentially of Si thereby to utilize conventional semiconductor manufacturing techniques of high yield.

According to a second aspect of the present invention, there is provided a semiconductor integrated memory device having a plurality of memory cells, each including a capacitor having first and second electrodes, and a dielectric layer interposed between the first and second electrodes, wherein the first electrode is formed on a main surface of a semiconductor substrate; a transistor formed on a surface of a single crystal semiconductor layer and with a lower surface of the single crystal semiconductor layer contacting the main surface of the substrate; the single crystal semiconductor layer having side surfaces formed on opposite sides of the capacitor through an insulator layer.

In this second aspect of the invention, the capacitor is first formed on a wide area on the substrate so that the process of forming the capacitor is concise and the formed capacitor easily tends to maintain a strained lattice structure. Further, the transistor active region is formed above the capacitor with the insulator layer interposed, and the side wall insulator layer may, be self-aligned to the side wall of the capacitor.

In the second aspect of the invention, the single crystal semiconductor layer may have an upper portion disposed above the capacitor and the transistor may be formed on the upper portion.

Furthermore, the side surface of the transistor may be interposed between two of the capacitors.

In the second aspect of the invention, the main surface of the substrate may be planar and the first electrode may be disposed on a part of the main surface of the semiconductor substrate.

Also, the main surface of the semiconductor substrate may have a portion defined by a trench, where the first electrode is disposed on an inner surface of the trench.

In the second aspect of the invention, the main surface of the semiconductor substrate may have a portion defined by a trench, an inner surface of the trench may have a $\{100\}$ crystal face, and the first electrode may be disposed on the inner surface. More preferably all inner surfaces have the $\{100\}$ crystal face.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawing, wherein.

DETAILED DESCRIPTION OF THE PREFERRED EMBODIMENTS

A method of manufacturing a semiconductor integrated memory device and a semiconductor integrated memory device which obtains and takes advantage of an epitaxially grown thin dielectric capacitor layer formed before formation of a semiconductor transistor region.

Figure 1A:
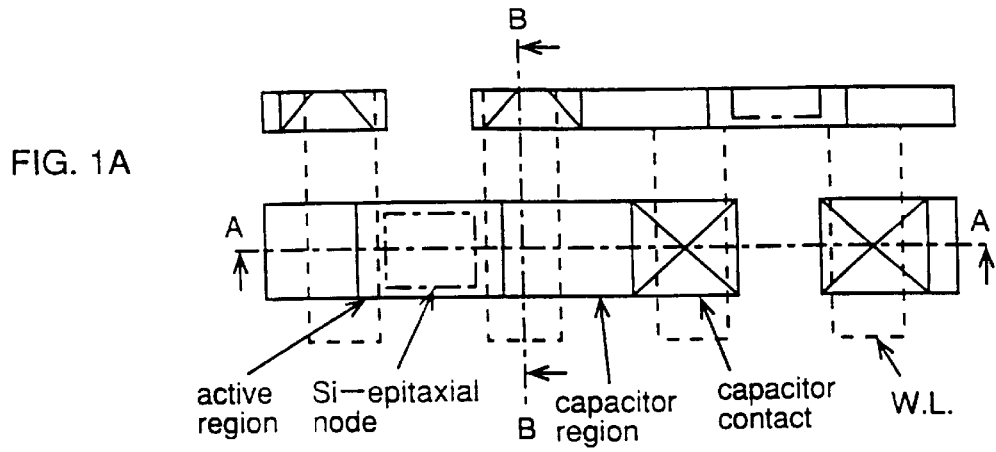
FIG. 1A and FIGS. 1B and 1C are plan and cross-sectional views, respectively, showing the memory device structure according to a first embodiment of the present invention.
Figure 1B:
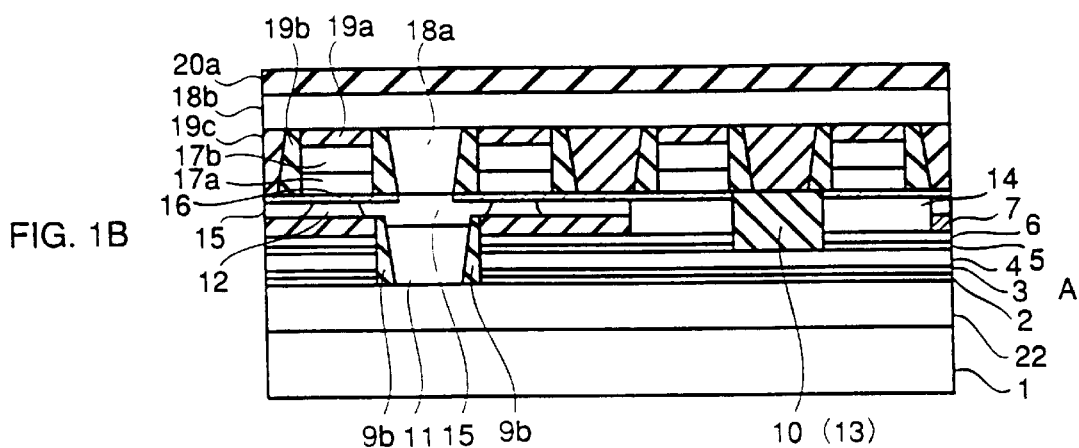
Figure 1C:
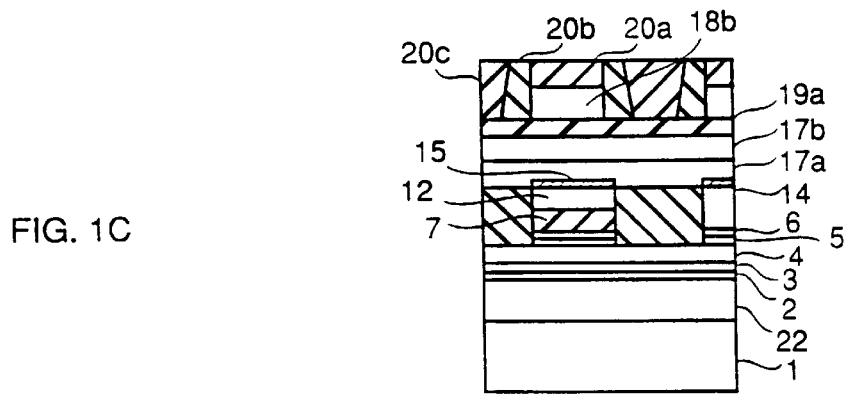

Referring now to the drawings, wherein like reference numerals identify the same or corresponding parts throughout the several views, a first embodiment is described with respect to FIG. 1A, which is plan view showing a semiconductor ferroelectric memory device according to a first embodiment of the present invention, FIG. 1B which is cross-sectional view of section A—A, and FIG. 1C which is cross-sectional view of section B—B. This first embodiment is directed to a method of manufacturing a semiconductor integrated memory device and a semiconductor integrated memory device which obtains and takes advantage of an epitaxially grown thin dielectric capacitor layer formed before formation of a semiconductor transistor region.

As shown in FIGS. 1A, 1B and 1C, the memory cell of the first embodiment includes a transistor and a capacitor. An impurities diffusion layer 22 of first impurity type is formed on a main surface of a semiconductor substrate 1 of second impurity type, as shown in FIG. 1B and 1C. The impurities diffusion layer 22 is a plate electrode. The capacitor includes a lower barrier metal layer 2, a lower electrode 3, a ferroelectric thin layer 4, an upper electrode 5, and an upper barrier metal layer 6, as shown in FIG. 1B. Those layers are formed and stacked in the above mentioned order on the main surface of the substrate by an epitaxial growth method, while the upper electrode 5 and the upper barrier metal layer 6 can be formed without epitaxial growth. A first insulator layer 7 is formed on the upper barrier metal layer 6, and second insulator layers 9b are formed on side walls of the capacitor stacked layers, as shown in FIG. 1B. A single crystal Si layer 12 is formed by epitaxial method on an node 11 formed at the bottom of an opening surrounded by the second insulator layers and is also disposed over the capacitor film, as shown in FIG. 1B. The node 11 is a seed for the epitaxial growth.

The transistor is formed on the single crystal Si layer 12. The transistor includes source/drain regions 15, a gate insulator layer 16, a first conductive layer 17a (impurities doped polycrystalline Si), and a second conductive layer 17b (metal silicide), as shown in FIG. 1B. The source/drain regions 15 are formed in the top surface of the singe crystal Si layer 12, and the gate insulator layer 16, the first conductive layer 17a, and the second conductive layer 17b are successively formed on the top surface of the single crystal Si layer 12, as shown in FIG. 1B. The first conductive layer 17a and the second conductive layer 17b serve as gate electrodes (Word Lines). Top surfaces of the gate electrodes are covered with a capping insulator layer 19a; side walls of the gate electrodes are selectively covered with side wall insulator layers 19b; and another insulator layer 19c is formed between the side walls insulator layer 19b except at a Bit Line (BL) contact plug 18a, as shown in FIGS. 1B and 1C. The BL contact plug 18a is formed on the top surface of one of the source/drain electrodes 15 to connect it with a BL 18b, as shown in FIG. 1B. The BL is formed above the transistor, as shown in FIGS. 1B and 1C. Capping insulator layer 20a are formed on the BL 18b, as shown in FIGS. 1B and 1C. Side walls of the BL 18b and cap insulator layer 20b are selectively covered with side wall insulator layers 20b, and an insulator layer 20c is formed between the side wall insulator layers 20b, as shown in FIGS. 1B and 1C. An insulator layer 10 is disposed between the transistor and the upper electrode 5, as shown in FIG. 1B. A contact plug 14 for connecting the source/drain electrodes 15 and upper electrodes 5 are formed in a capacitor contact hole 13 next to the insulator layer 10, as shown in FIG. 1B. The device structure shown in FIGS. 1A, 1B, and 1C, as well structures shown in other Figures, may be repeated on each of semiconductor chips to achieve high density integration for practical use.

Next described are steps of manufacturing the semiconductor integrated ferroelectric memory device of the first embodiment.

Figure 2A:
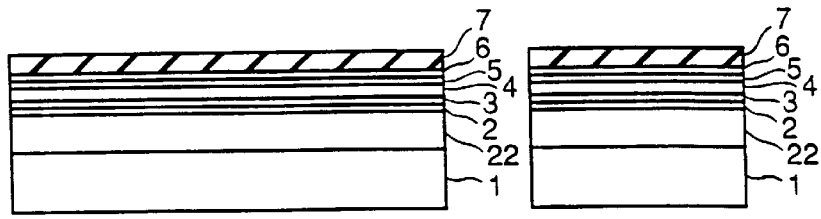
FIGS. 2A, 2B, 2C, and 2D are cross-sectional views showing manufacturing method of the epitaxial growth capacitor and the transistor according to the first embodiment.

The second impurity type diffusion layer 22 is formed by ion implantation and thermal annealing in the (100) main surface of the Si substrate, as shown in FIG. 2A. The lower barrier metal layer 2, the lower electrode 3, and the ferroelectric layer 4 are successively formed in this order on the main surface of the substrate by epitaxial growth method using RF sputter or DC sputter deposition at 600° C. (substrate temperature). The deposition is sequentially performed without exposing the substrate to air. The structure includes a 10 nm (Ti, Al) N layer, a 20 nm SrRuO$_3$ layer, and a 20 nm BSTO thin layer. The first insulator layer 7 is formed on the top surface of the upper barrier metal layer 6, as shown in FIG. 2D.

Figure 2B:
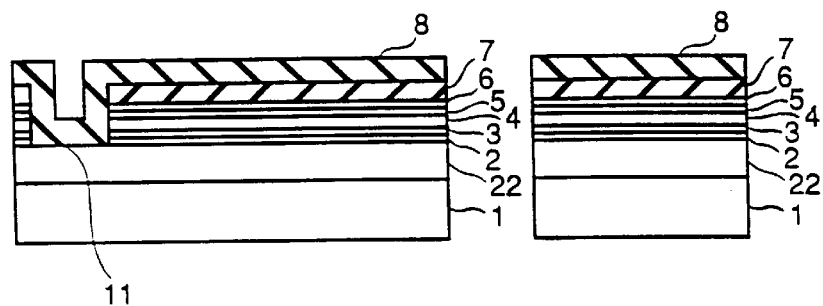
Figure 2C:
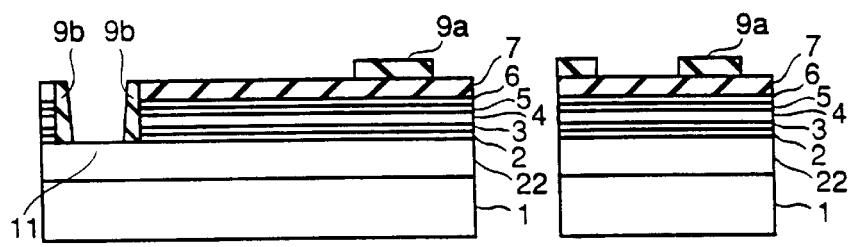
Figure 2D:
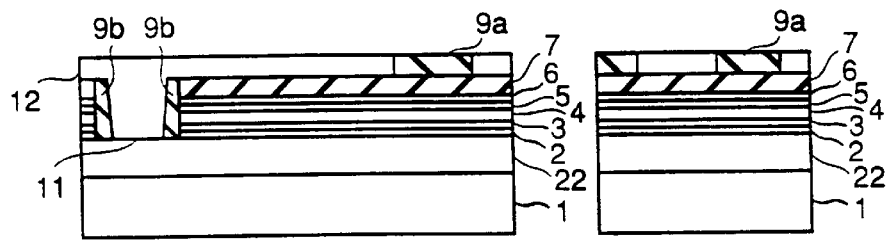

The node 11, an epitaxial seed for the single crystal Si growth, is formed by lithography and etching steps, as shown in FIG. 2B. Etching can be performed using Reactive Ion Etching (RIE). The second insulator layer 8 is deposited to be conformable to surfaces of the first insulator layer 7 and the bottom of the node 11, as shown in FIG. 2D. The side wall insulators 9a, 9b are formed to be self-aligned to the side walls of the capacitor by means of an anisotropic etching step, such as RIE, as shown in FIG. 2C.

Damage provided on the surface of the Si layer by the anisotropic etching step is removed by wet etching using hydrogen fluoride vapor. The single crystal layer 12 is formed on the node 11 by epitaxial growth using Chemical Vapor Deposition (CVD) at 750° C., as shown in FIG. 2D. 1 m Torr SiH$_4$ gas and 0.1 m Torr AsH$_3$ gas are provided in the CVD chamber as source gas of CVD. The top surface of the single crystal layer 12 is polished by chemical mechanical polishing method, as shown in FIG. 2D. The insulator layer 9a may be used as a mark to determine when to stop the polishing.

Figure 3A:
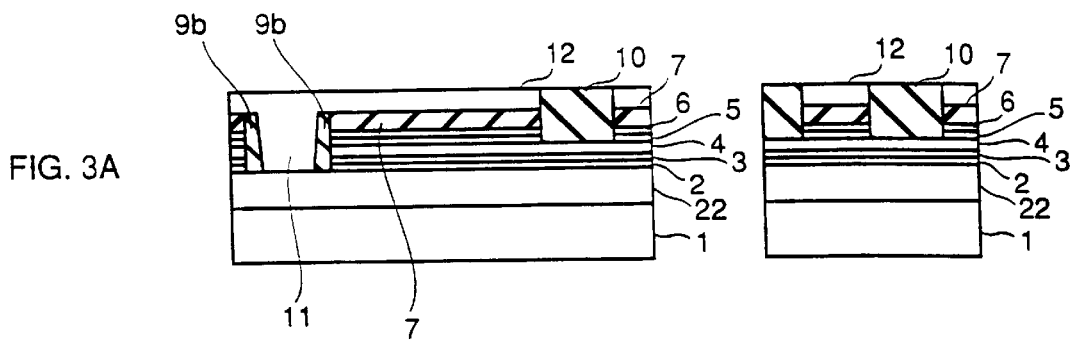
FIGS. 3A, 3B, and 3C are cross-sectional views following the method shown in FIG. 2D and showing steps for manufacturing the epitaxial capacitor and the transistor according to the first embodiment.

A trench positioned between adjacent memory cells is formed by selectively removing a portion of the insulator 9a, the insulator layer 7, the upper barrier metal layer 6, and the upper electrode 5 by etching process using RIE, as shown in FIG. 3a. The etching may be followed by selective wet etching. The single crystal Si layer 12 may be used as mask for the etching step. The insulator layer 10 insulating between the adjacent memory cells is formed by burying the insulator layer in the trench, as well as on an other surface of the substrate 1, and by polishing the surface of the insulator layer, as shown in FIG. 3A. The polishing process is continued until the surface of the single crystal Si layer 12 is exposed. The width of the transistor region can be narrower than that of the node 11 extending along the word line so as to completely insulate the upper barrier metal layer 6 and the upper electrode 5 by adjusting, the width of the trench.

Figure 3B:
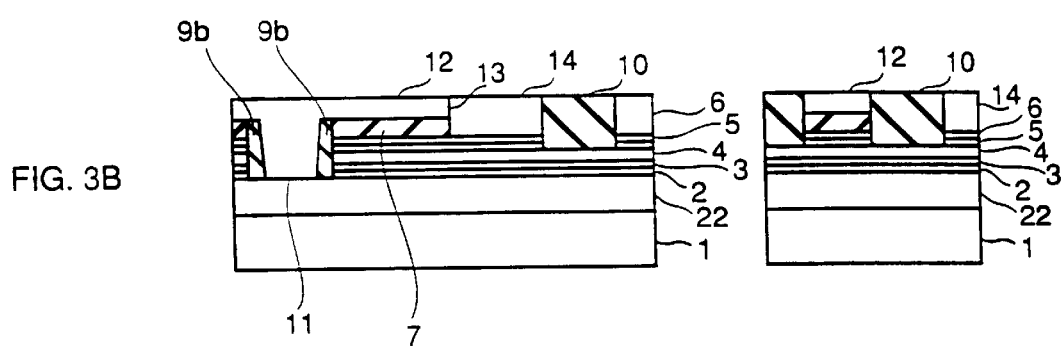

Opening 13 for a capacitor contact is formed by selectively removing a portion of the Si layer 12 and the insulator layer 7 by lithography and etching steps. The upper barrier metal layer 6 or the upper electrode 5 may be used as an etching stopper. A 200 nm thick N+ type impurities doped polycrystalline Si layer is formed over the main surface of the substrate 1 and the contact plug 14 is selectively formed in the opening by polishing the surface of the polycrystalline Si layer, as shown in FIG. 3B.

Figure 3C:
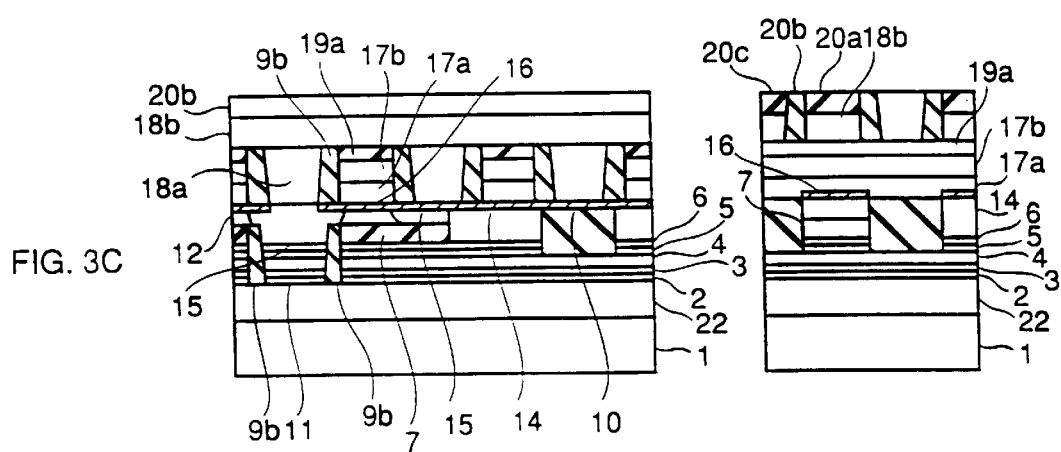

The BL 18b, BL plug 18a, and the transistor comprising the impurities diffusion layers 15, the gate oxide layer 16, and WL 17a, 17b, are formed by a process well known in the art, as shown in FIG. 3C. The device according to this embodiment is manufactured by the above described concise process and provided with high integration density.

Figure 4A:
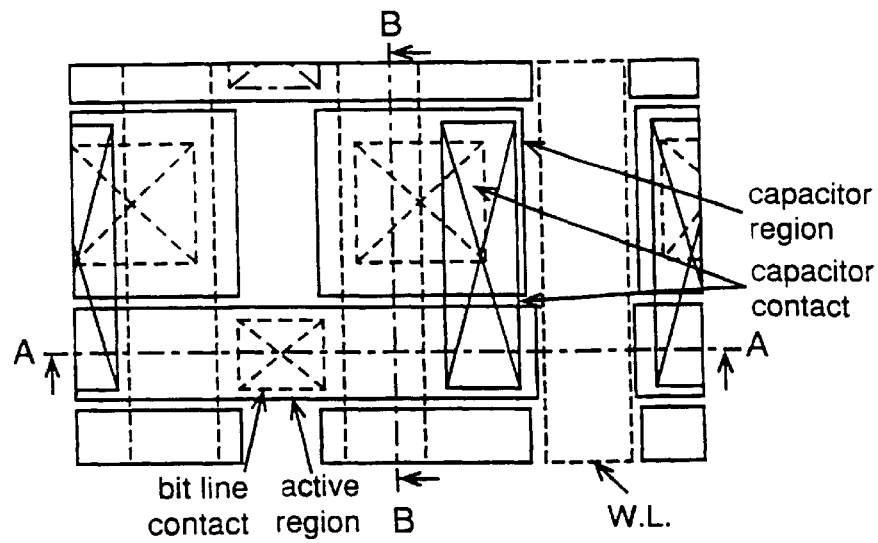
FIGS. 4A, 4B, and 4C are plan and cross-sectional views showing the device structure having a 3f×3f area, according to a second embodiment of the present invention.
Figure 4B:
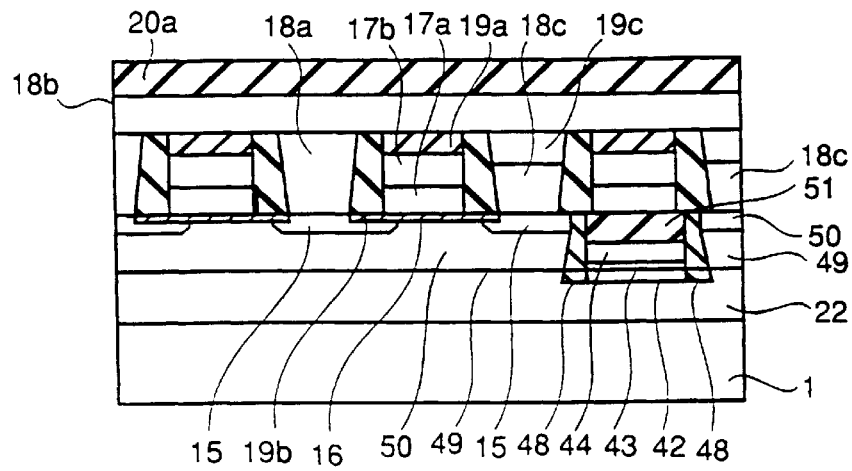

FIG. 4A is plan view showing a semiconductor ferroelectric memory device according to a second embodiment of the present invention. FIG. 4B is a cross-sectional view of section A—A shown in FIG. 4A and FIG. 4C is a cross-sectional view of section B—B shown in FIG. 4A.

A memory cell of the second embodiment includes a plan structure capacitor and a transistor. In this embodiment, the capacitor is horizontally adjacent to the active region of the transistor, and a single memory cell of the device is formed in an area of 3f×3f, when f is length of finest pattern of lithography.

A first impurity type diffusion layer (a plate electrode) 22 is formed in a main surface of a second impurities type semiconductor substrate 1, as shown in FIG. 4B. A lower barrier metal layer 42, a lower electrode 43, a ferroelectric layer 44, an upper electrode 45, and an upper barrier metal layer 42 are sequentially stacked by epitaxial growth in the order mentioned on the first impurity type diffusion layer 22, as shown in FIGS. 4B and 4C. The upper electrode 45, and the upper barrier metal layer 46 may be formed by substitution methods. A first insulator layer 47 is formed on the top surface of the upper barrier metal layer 46, and a second insulator layer 48 is selectively formed on side walls of the stacked structure, as shown in FIG. 4C.

Figure 4C:
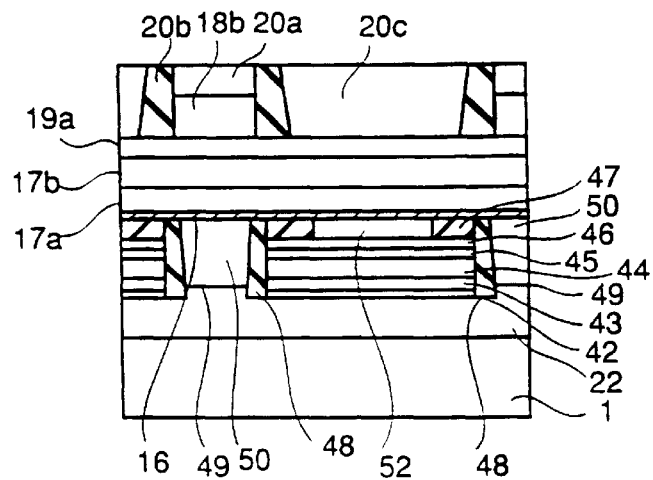

A single crystal Si layer 50 is formed on a node (seed) 49 by epitaxial growth, as shown in FIGS. 4B and 4C. The transistor is formed on the single crystal Si layer 50, as shown in FIG. 4B. An insulator layer 51 insulates adjacent transistor and the upper electrode, 45, as shown in FIG. 4B.

A contact plug 52 is formed in an opening of the insulator layer 47 so as to connect the upper electrode 45 and a source/drain electrode of the transistor via the upper barrier metal layer 46, as shown in FIG. 4C. The contact plug 52 and the impurity diffusion layer 15 are connected via contact plug 18c, as shown in FIGS. 4B and 4C. An insulator layer 19c is disposed on the contact plug 18c to insulate BL 18 b from the contact plug, as shown in FIG. 4B.

Next described are steps for manufacturing the semiconductor integrated ferroelectric memory device according to the second embodiment.

Figure 5A:
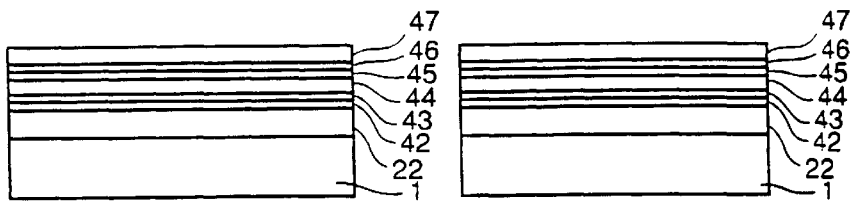
FIGS. 5A, 5B, 5C, and 5D are cross-sectional views showing manufacturing method of the device structure according to the second embodiment.

The impurity diffusion layer 22, the lower barrier metal layer 42, the lower electrode 43, the ferroelectric layer 44, the upper electrode 45, the upper barrier metal layer 46, and the first insulator layer 47 are sequentially stacked as shown in FIG. 5A in the same manner as the first embodiment.

Figure 5B:
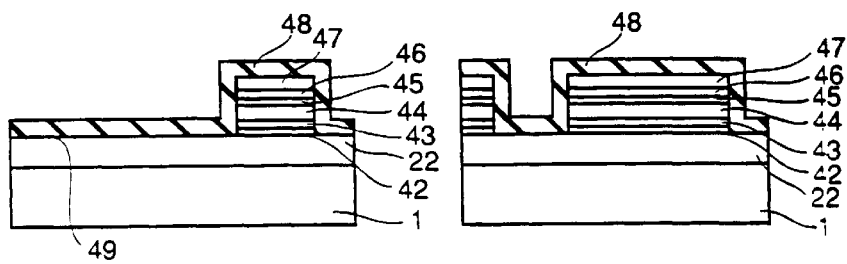

The node 49 of about 1f×1f surface area is formed by lithography and etching steps, as shown in FIG. 5B. The surface of the node 49 and the substrate 1 is conformable and covered with a second insulator layer 48, as shown in FIG. 5B.

Figure 5C:
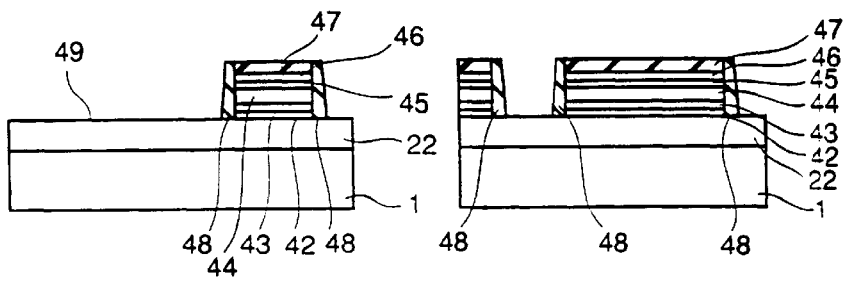

The side wall insulator layers 48 are formed selectively and self-aligned to both side walls of the stacked structure by anisotropic etching, such as RIE, as shown in FIG. 5C.

Figure 5D:
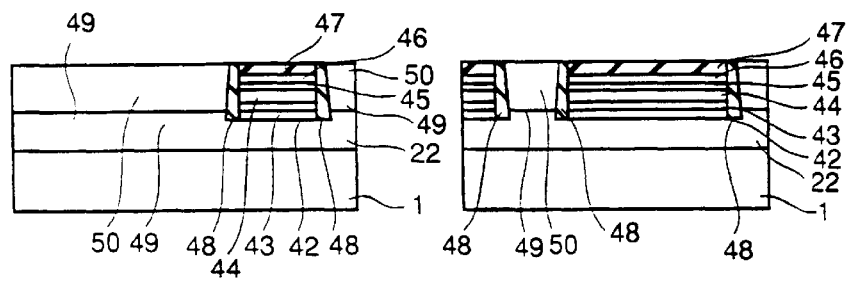

Etching the Si surface using HF vapor and selective epitaxial growth of the single crystal Si layer are performed as shown in FIG. 5D, in same manner as in the first embodiment. The top surface of the single crystal Si layer is polished by a CMP method so as to be planar with the top surface of the insulator layers 47, 48, as shown in FIG. 5D.

Figure 6A:
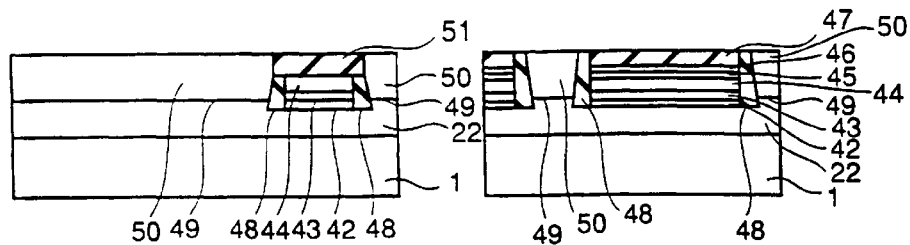
FIGS. 6A, 6B, and 6C are cross-sectional views following the method shown in FIG. 5D and showing steps for manufacturing the device according to the second embodiment.

The insulator layer 47, the upper barrier metal layer 46, and the upper electrode 45 at the device insulator region are removed selectively, as shown in FIG. 6A. The removed region is buried with insulator layer and surface of the insulator layer is polished until the surface of the insulator layer become planar with surface of the Si layer 50, as shown in FIG. 6A.

Figure 6B:
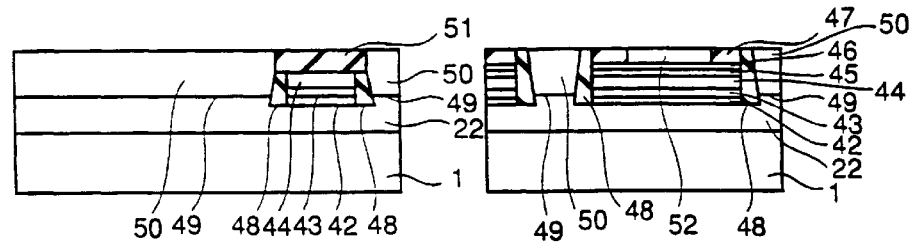
Figure 6C:
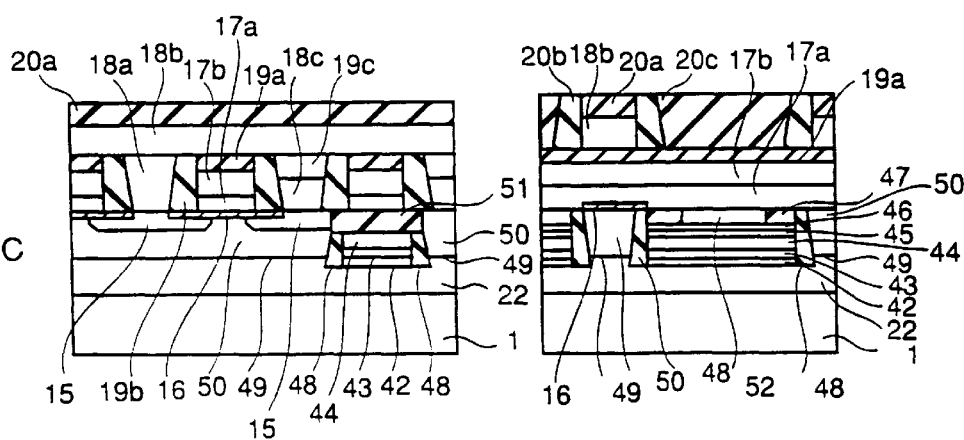

A portion of the insulator layer 47 is removed using lithography and etching steps so as to form a contact opening, as shown in FIG. 6A. The etching may be continued until the surface of the upper barrier metal layer 46 or the surface of the upper electrode 45 appears. Either one of the surfaces may be used as an etching stopper. An N-type impurities doped polycrystalline Si layer is formed on the substrate 1, and the surface of the polycrystalline Si layer (the contact pug) 52 is polished until it become planar with the surface of the remaining insulator layer 47, as shown in FIG. 6B.

The impurity diffusion layer 15, the gate oxide layer 16, the gate electrode (WL) 17a, 17b, the BL contact plug 18a, the BL 18b, the contact plug 18c are formed on the surface of the Si layer 50, the contact plug 52, the insulator layer 51, and the insulator layer 47.

Figure 7A:
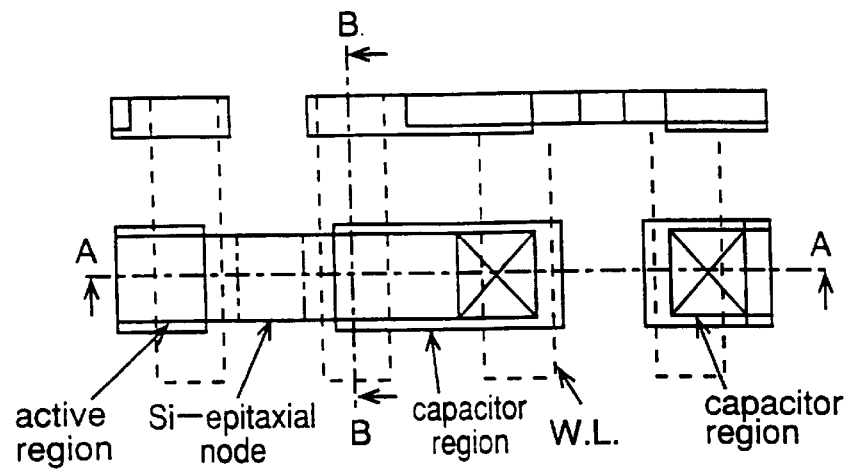
FIG. 7A and FIGS. 7B and 7C are plan and cross-sectional views, respectively, showing a memory device structure having capacitor formed in a substrate trench according to a third embodiment of the present invention.
Figure 7B:
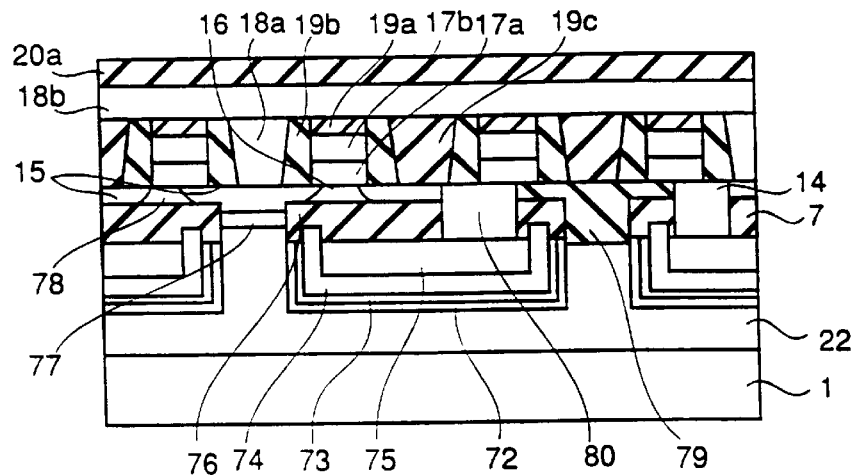
Figure 7C:
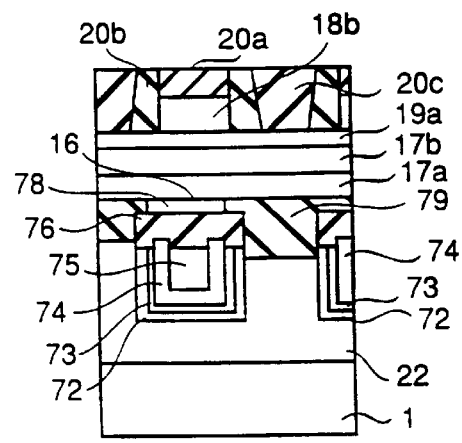

FIG. 7A is plan view showing memory cell of DRAM according to the third embodiment. FIG. 7B is cross-sectional view of section A—A shown in FIG. 7A and FIG. 7C is cross-sectional view of section B—B shown in FIG. 7a.

First, impurity type diffusion layer 22 is formed in a main surface of a first impurity type Si substrate 1, as shown in FIG. 7A. Then a trench is formed on the main surface and an epitaxcial capacitor layer is formed in the trench and the trench is surrounded by {100} surface of the substrate 1, as shown in FIGS. 7B and 7C.

The epitaxial capacitor includes a lower barrier metal layer 72, a lower electrode 73, a dielectric layer 74, and an upper electrode 75. All of these stacked layers are formed by epitaxial growth. The structure may be modified to place the upper barrier metal layer on the upper electrode 75. A single crystal Si layer 78 is formed on the stacked structure using a node 77 as a seed of epitaxial growth, as shown in FIG. 7B. An insulator layer 79 insulates a transistor and the upper electrode 75 which is adjacent to the transistor, as shown in FIG. 7B.

A. contact plug 80 electrically connects source/drain electrode 15 and the upper electrode 75, as shown in FIG. 7B. The contact plug 80 is formed in an opening formed in an insulator layer 76 and is adjacent to an insulator layer 79, as shown in FIG. 7B.

The following are steps for manufacturing the semiconductor integrated memory device according to the third embodiment.

Figure 8A:
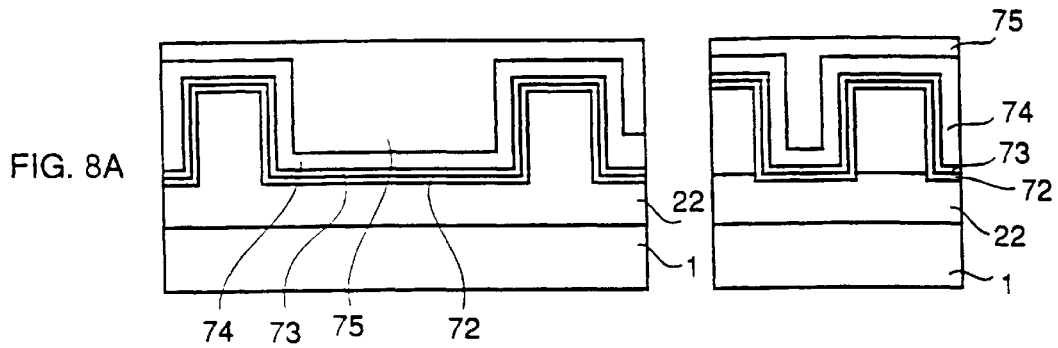
FIGS. 8A, 8B, 8C, and 8D are cross-sectional views showing manufacturing steps according to the third embodiment.

A trench is formed in impurities diffusion layer 22 of a main surface of the Si substrate 1 by lithography and etching, as shown in FIG. 8A. A 10 nm thick (Ti, Al)N layer 72 is conformably formed on surface of the trench by epitaxial growth using MOCVD, as shown in FIG. 8A. $Al(CH_3)_3$, $Ti(C_2H_5)_2$, and $NH_3$ may be used as source gases, and the forming temperature of MOCVD is 800° C. A 20 nm thick $SrRuO_3$ layer 3 is conformably formed by epitaxial growth using MOCVD, as shown in FIG. 8A. Sr(THD) and $Ru(C_5H_5)_2$ are used as source gasses and $O_2$ is used as oxidation material, where THD is 2,2,6,6.6-Thetramethyl-3,5-Heptadionate. The forming temperature of the MOCVD process is 800° C.

A 20 nm thick Ba 30% molar fraction layer 74 is conformably epitaxial grown on the $SrRuO_3$ layer 73, as shown in FIG. 8A, using MOCVD. The forming temperature is 800° C. and $Sr(THD)_2$, $Ba(THD)_2$, and $TiO(THD)_2$ are used as source gasses. A 20 nm thick SRO layer was formed so as to fill the trench, as shown in FIG. 8A, by epitaxial growth using MOCVD. $Sr(THD)_2$, $Ru(C_5H_5)_2$, and $O_2$ are used as source gases and the forming temperature is 800° C.

Figure 8B:
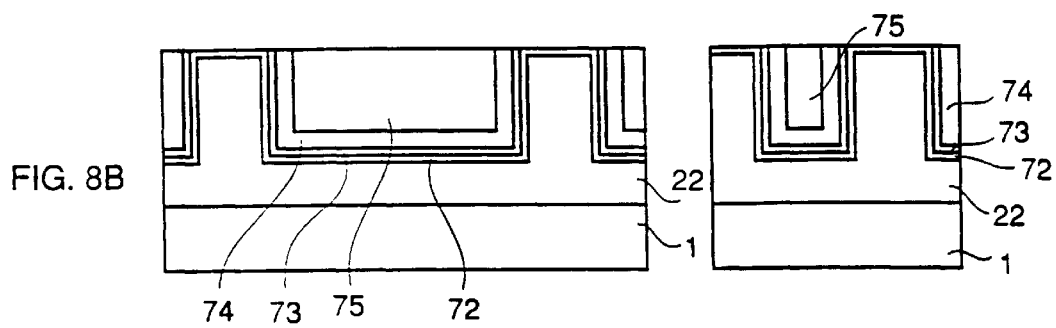
Figure 8C:
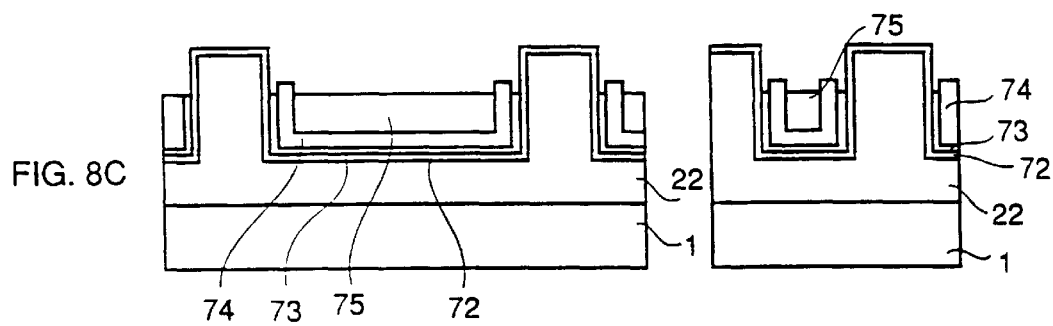

The upper electrode 75 is polished until its surface become planar with surface of the barrier metal layer 72 using the barrier metal layer 72 as stopper layer, as shown in FIG. 8B. Top portions of the upper and lower electrodes 75, 73 and dielectric layer 74 are selectively etched and removed, as shown in FIG. 8C. Selective wet etching or/and RIE may be used to perform etching. It is preferable to remove the top surface of the dielectric layer deeper than the top surfaces of the electrode layers 75, 73 to reduce leakage current at capacitor edge portion, as shown in FIG. 8C.

Figure 8D:
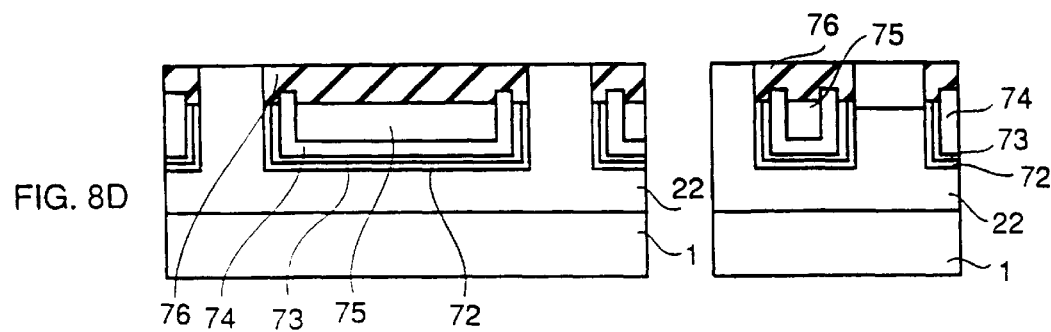
Figure 9A:
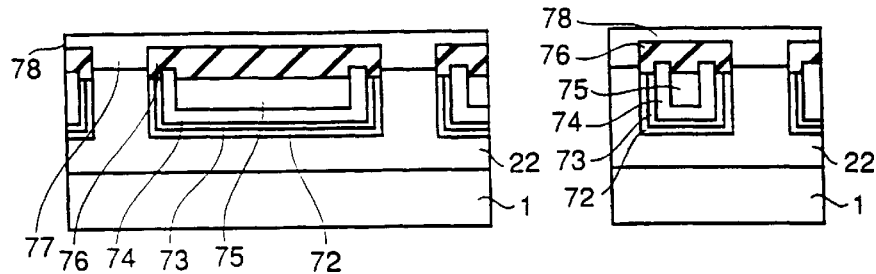
FIGS. 9A, 9B, and 9C are cross-sectional views of manufacturing steps following the FIG. 8D to describe the manufacturing method according to the third embodiment.

The exposed top portion of the barrier metal layer 72 is etched and removed, as shown in FIG. 8D, and the first insulator layer 76 is formed on the Si substrate surface by plasma CVD using TEOS gas as a source gas. Then the surface is polished until it becomes planar with the surface of Si layer 22, as shown in FIG. 9A. The surface of the Si layer 22 is etched using HF vapor to remove surface damage and to form the node 77 for single crystal epitaxial growth, as shown in FIG. 9A. The single crystal Si layer 78 is formed on the node 77 by selective epitaxial growth, as shown in FIG. 9A.

Figure 9B:
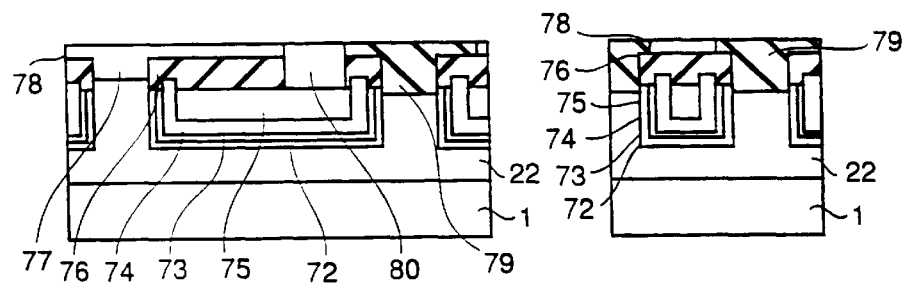
Figure 9C:
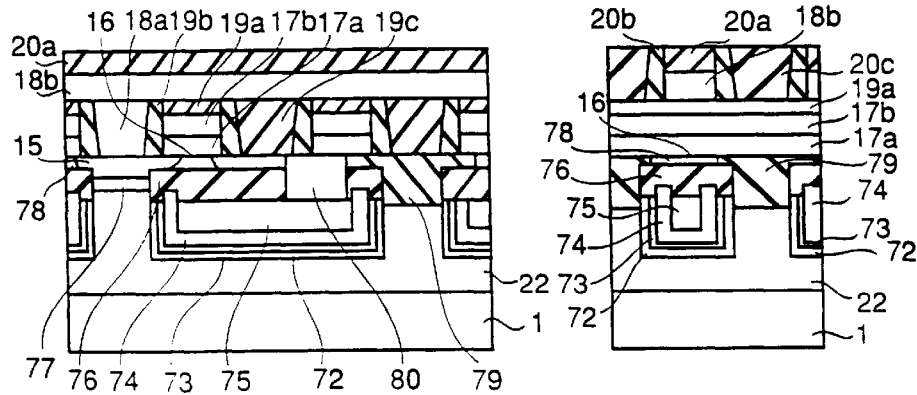

Trench 80 is formed in the Si layer 78 by lithography and etching steps, as shown in FIG. 9B. Insulator layer 79 is formed by filling the trench and polishing. The polishing step ma y be continued until surface of the insulator layer 79 becomes planar with surface of the Si layer 78, as shown in FIG. 9B. An opening is formed by removing portion of the Si layer 78 until surface of the upper electrode 75 is exposed, as shown in FIG. 9B. The upper electrode can be used as an etching stopper. In the case where the upper barrier metal layer is used, either the upper electrode 75 or the upper barrier metal layer may be used as an etching stopper. The contact plug 80 is formed by deposition of an $N^+$type polycrystalline Si layer and polishing its surface by CMP. The polishing may be continued until the surface of the contact plug 80 becomes planar with the surface of the insulator layer 79, as shown in FIG. 9B.

The transistor including the impurity diffusion layer 15, the gate oxide layer 16, WL 17a, 17b, and BL contact plug 18a, BL 18b are formed on the Si layer 77, by using well known methods.

Figure 10A:
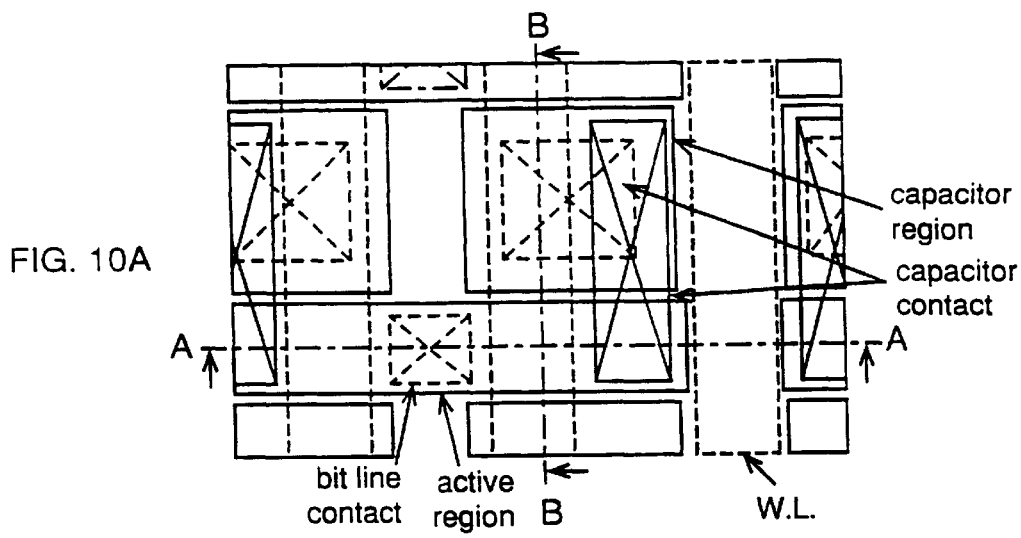
FIGS. 10A, 10B, and 10C are plan and cross-sectional views showing the device structure having another device formation according to a fourth embodiment of the present invention.
Figure 10B:
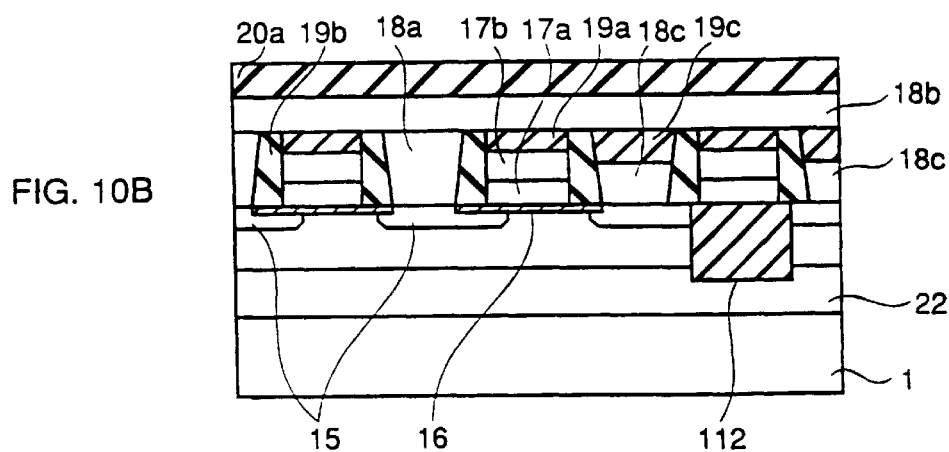

FIG. 10A is plan view showing a memory cell of a DRAM device according to the fourth embodiment. FIG. 10B is a cross-sectional view of section A—A shown in FIG. 10A, and FIG. 10C is a cross-sectional view of section B—B shown in FIG. 10A.

A first type impurity diffusion layer (plate electrode) 22 is formed on a main surface of a first type impurity Si substrate 1, as shown in FIGS. 10A and 10B. A trench is formed in the first type impurities diffusion layer 22 and is surrounded by the {100} surface of the Si substrate 1, as shown FIG. 10C. A stacked capacitor is formed in the trench, as shown in FIG. 10C.

The stacked capacitor includes a lower barrier metal layer 102, a lower electrode 103 a dielectric thin layer 104, an upper electrode 105, and an upper barrier metal layer 106. The stacked layers are formed by epitaxial growth. The upper electrode 105 and the upper barrier metal layer 106 may be formed by a substitute forming method. A first insulator layer 107b is formed on the stacked capacitor, and side wall insulator layers 108 are formed on side walls of the trench.

Figure 10C:
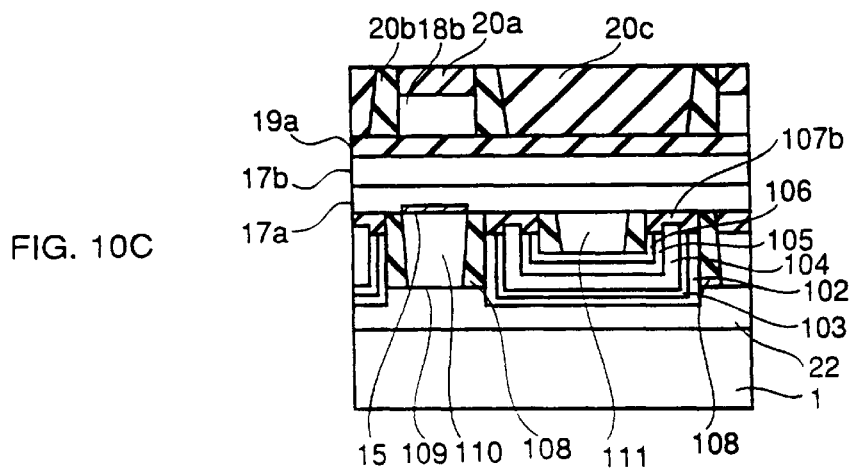

A node 109 serves as a seed for epitaxial growth of single crystal Si layer 110 and is formed adjacent to a transistor, as shown in FIG. 10C. The transistor is insulated by insulator layer 112, as shown in FIG. 10B.

Contact plug 111 is formed on the upper barrier metal layer 106 and connects the metal layer 106 and transistor source/drain region 15 via a contact plug 18c, as shown in FIG. 10A, 10B, and 10C. An insulator layer 19c is formed to insulate the contact plug 18c and a BL 18b.

The following are steps for manufacturing the semiconductor integrated memory device according to the fourth embodiment.

Figure 11A:
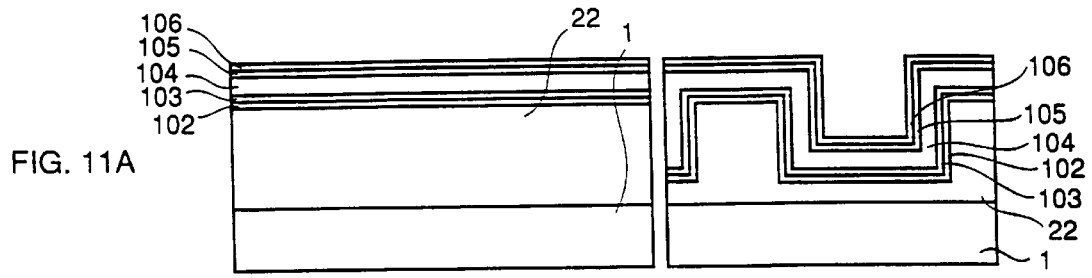
FIGS. 11A, 11B 11C, and 11D are cross-sectional views and are showing manufacturing method for the memory device according to the fourth embodiment.

The trench of 2f×2f size is formed in the impurities diffusion layer 22. The lower barrier metal layer 102 and the lower electrode 103 are formed, as shown in FIG. 11A, in the same manner as the third embodiment. BSTO thin layer 104 and upper electrode 105 are formed(l, as shown in FIG. 1B, by the same method described in the third embodiment. A 10 nm thick (Ti, Al)N layer (the upper barrier metal layer) 106 is epitaxially grown on the BSTO thin layer 104 at 1000° C. growth temperature, using $Al(CH_3)_3$, $Ti(C_2H_5)_2$, $NH_3$ as source gasses, as shown in FIG. 11A.

Figure 11B:
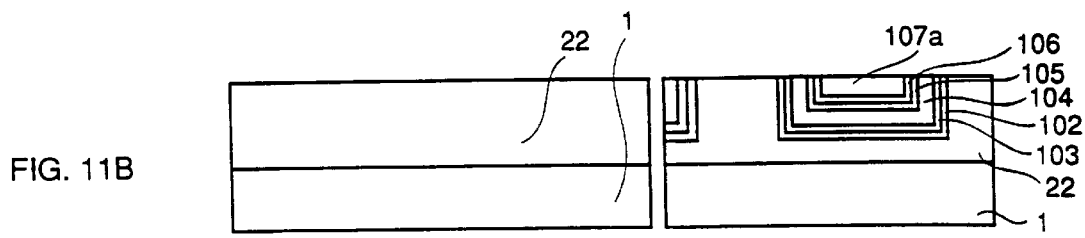

An insulator layer 107a is formed on the (Ti, AL)N layer 106 and top portions of the layer 107a, the upper and lower barrier metal layer 106, 102, the upper and lower electrode 105, 103, and the dielectric layer 104 are polished until those top surfaces become planar with each other, as shown in FIG. 11B.

Figure 11C:
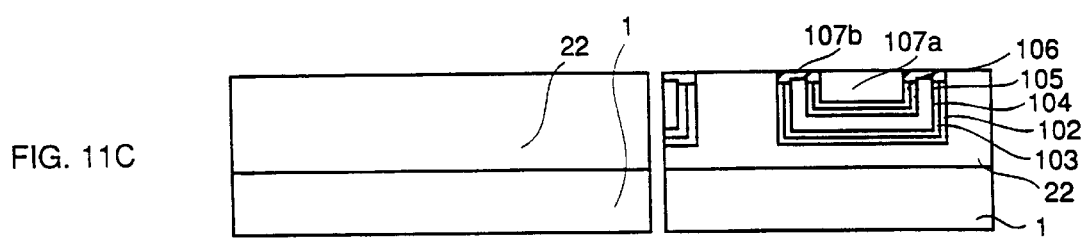

Top portions of the upper and lower barrier metal layers 106, 102, the upper and lower electrode 105, 103, and dielectric layer 104 are selectively etched, as shown in FIG. 11C. The first insulator layer 107b is formed by CVD deposition and polishing on its surface.

Figure 11D:
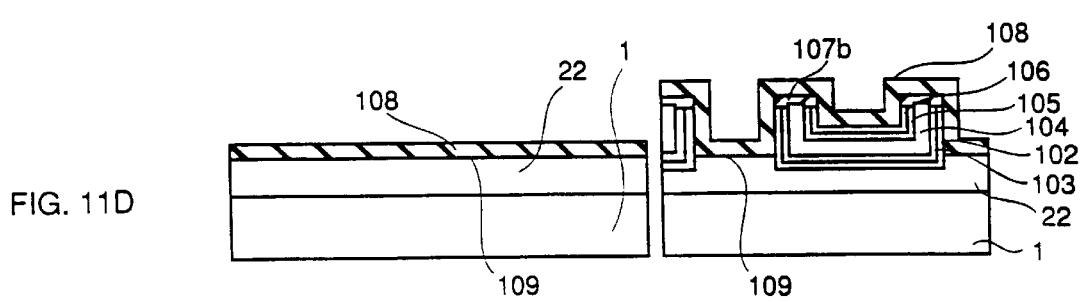

The exposed top portion of the Si layer 22 is selectively removed by lithography and etching, and the node 109 and capacitor contact are exposed, as shown in FIG. 11D. The second insulator layers 108 are formed as shown in FIG. 11D.

Figure 12A:
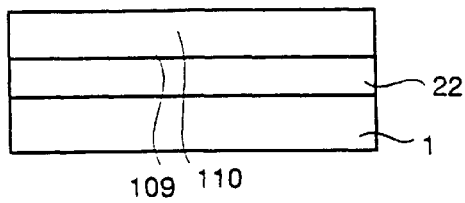
FIGS. 12A, 12B, and 12C are cross-sectional views following FIG. 11D and for manufacturing the device according to the fourth embodiment.
Figure 12A:
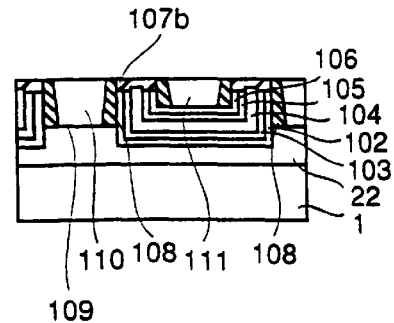

The insulator layers 108 are formed self-aligned to side walls of the lower barrier metal layer 102 by anisotropic etching, as shown in FIG. 12A. Surface damages of the Si layer 22 is removed by HF etching and the single crystal Si layers 110 are formed on the node 109 by selective epitaxial growth using CVD. SiH$_4$ gas at 1 m Torr and AsH$_3$ gas at 0.1 m Torr are use,d as source gases at 750° C. in the CVD. The contact plug 111 is formed by conformable deposition of polycrystalline Si and polishing, as shown in FIG. 12A.

Figure 12B:
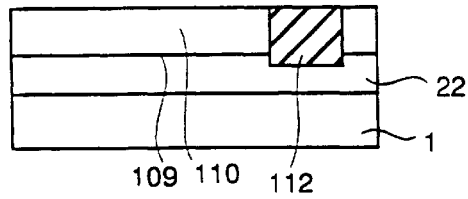
Figure 12B:
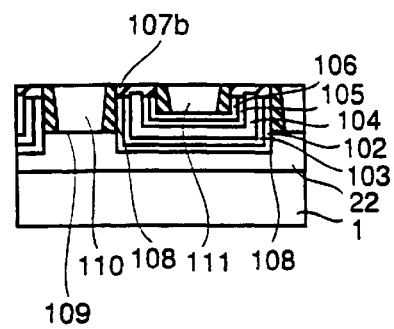
Figure 12C:
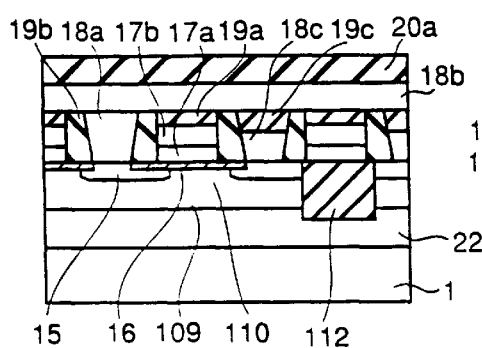
Figure 12C:
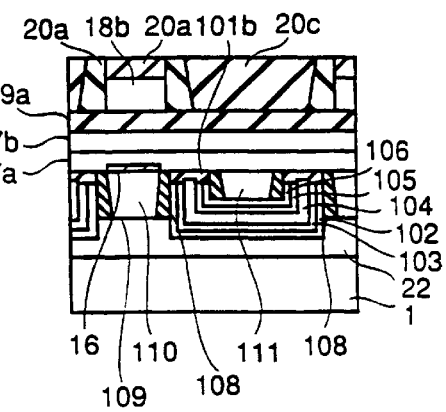

A trench is formed on the Si layer and the insulator layer 112 is formed by deposition and polishing, as shown in FIG. 12B.

The transistor including the impurities diffusion layers (the source/drain regions) 15, gate oxide layer 16, WL 17a, 17b and the BL contact plug 18a, the BL 18b, and the contact plug 18c are formed as shown in FIG. 12A.

While the invention has been particularly shown and described with reference to preferred embodiments thereof, it will be understood by those skilled in the art that various other changes in the form and details may be made therein without departing from the spirit and scope of the invention. For example, the shape of the seeds can be changed. The node may be band shaped extending in one direction and be parallel to the Wls.

A Si substrate 1 may be substituted with a SiGe substrate, semiconductor compound substrate, or SOI substrate.

The memory device of the present invention may be introduced to a one-chip device on which information is transferred between the memory device and a logic circuit both formed on the one chip. A variety of usages of the one-chip device, such as LSI, a non-touch Integrated Circuit (IC) Card, and a memory card for personnel information, have been reported and the present invention may be applied to those usage.

Obviously, numerous modifications and variations of the present invention are possible in light of the above teachings. It is therefore to be understood that within the scope of the appended claims, the invention may be practiced otherwise than as specifically describer herein.

What is claimed as new and desired to be secured by Letters Patent of the United States is:

1. A method for manufacturing a semiconductor integrated memory device having a plurality of memory cells, comprising steps of:
   forming a first electrode on a main surface of a semiconductor substrate;
   forming an epitaxially grown dielectric layer on the main surface of the semiconductor substrate;
   forming a second electrode on the dielectric layer so as to form a capacitor, the acapacitor comprising the first electrode, the dielectric layer, and the second electrode;
   removing a region of the capacitor so as to expose the main surface under the region;
   forming a side wall insulator layer on a side wall of the capacitor;
   forming an epitaxially grown semiconductor single crystal layer on the exposed main surface; and
   forming a transistor on the semiconductor single crystal layer.

2. A method as set forth in claim 1, wherein the second electrode is formed by an epitaxial growth step.

3. A method as set forth in claim 1, further comprising:
   forming an interlayer insulator layer to cover top surfaces of the capacitor, and followed by forming of the epitaxially grown semiconductor single crystal layer.

4. A method as set forth in claim 3, wherein the interlayer insulator layer is formed by forming an insulator layer so as to conformably cover the capacitor and selectively leaving the side wall insulator layers on both side walls of the capacitor.

5. A method as set forth in claim 3, wherein the interlayer insulator layer covering the capacitor insulates memory cells adjacent to each other.

6. A method as set forth in claim 1, wherein the single crystal semiconductor layer is formed by a selective epitaxial growth process or a solid phase epitaxial growth process.

7. A method as set forth in claim 1, wherein forming a pattern of the transistor on the semiconductor single crystal layer and forming a pattern of the second electrode are separate performed.

8. A method as set forth in claim 7, wherein the second electrode is formed by utilizing the pattern of the transistor as a mask.

9. A method as set forth in claim 1, wherein the memory cell is formed on a planar portion of the main surface.

10. A method as set forth in claim 1, further comprising:
    forming a trench in the main surface of the substrate, wherein a crystal face of the trench is {100}, and the first electrode and the dielectric layer are formed by epitaxial growth in the trench.

11. A method as set forth in claim 1, wherein a crystal face of at least one of the first and second electrodes is selected from the group consisting of a {100} face of a cubic perovskite crystal structure, a {001} face of a tetragonal perovskite structure, and a {001} face of a lacer perovskite structure.

12. A method as set forth in claim 1, wherein a crystal face of the dielectric layer is selected from the group consisting of a {100} face of a cubic perovskite crystal structure, a {001} face of a tetragonal perovskite structure, and a {001} face of a layer perovskite structure.

13. A method as set forth in claim 1, wherein at least one of the first and second electrodes are formed of an element selected from the group consisting of a conductive oxide material ABO$_3$ of perovskite structure, Pt, Au, Pd, Ir, Rh, Re, Ru, an alloy thereof, and an oxide thereof.

14. A method as set forth in claim 1, wherein the insulator layer is formed of ABO$_3$ of perovskite crystal structure, where A is an element selected from the group consisting of Ba, Sr, and Ca, and B is an alloy selected from the group consisting of Ti, Zr, Hf, Sn, $(Mg_{1/3}Nb_{2/3})$, $(Mg_{1/3}Ta_{2/3})$, $(Zn_{1/3}Nb_{2/3})$, $(Mg_{1/2}Te_{1/2})$, $(Co_{1/2}W_{1/2})$, $(Mg_{1/2}W_{1/2})$, $(Mn_{1/2}W_{1/2})$, $(Sc_{1/2}Nb_{1/2})$, $(Mn_{1/2}Nb_{1/2})$, $(Sc_{1/2}Ta_{1/2})$, $(Fe_{1/2}Nb_{1/2})$, $(Co_{1/3}Nb_{2/3})$, $(Ni_{1/3}Nb_{2/3})$, $(Co_{1/3}Ta_{2/3})$, and $(Ni_{1/3}Ta_{2/3})$.

15. A method as set forth in claim 1, wherein the semiconductor substrate and the single crystal layer consist essentially of Si.

16. A method as set forth in claim 13, wherein the insulator layer comprises ABO$_3$ of perovskite crystal structure.

17. A method as set forth in claim 1, wherein one of the first and the second electrodes comprises a SrRuO$_3$ layer, and said dielectric layer comprises a Ba$_x$Sr$_{1-x}$TiO$_3$ (BSTO) ferroelectric layer.

18. A method as set forth in claim 1, wherein the substrate comprises a substrate selected from the group consisting of a Si substrate, a SiGe substrate, a compound semiconductor substrate, and an SOI substrate.

19. A method as set forth in claims 1, wherein the dielectric layer comprises a ferroelectric layer.

20. A method as set forth in claim 1, wherein the device is a Dynamic Random Access Memory.

21. A method as set forth in claim 1, wherein the device is a Ferroelectric Random Access Memore.

* * * * *